(12) United States Patent
Zhang

(10) Patent No.: US 11,758,340 B2
(45) Date of Patent: Sep. 12, 2023

(54) FLEXIBLE CIRCUIT BOARD OF HEARING AID AND HEARING AID

(71) Applicant: Xiamen Retone Hearing Technology Co., Ltd., Xiamen (CN)

(72) Inventor: Chengxiang Zhang, Xiamen (CN)

(73) Assignee: Xiamen Retone Hearing Technology Co., Ltd., Xiamen (CN)

( * ) Notice: Subject to any disclaimer, the term of this patent is extended or adjusted under 35 U.S.C. 154(b) by 158 days.

(21) Appl. No.: 17/338,716

(22) Filed: Jun. 4, 2021

(65) Prior Publication Data

US 2022/0303698 A1 Sep. 22, 2022

(30) Foreign Application Priority Data

Mar. 19, 2021 (CN) .......................... 202110305779.8

(51) Int. Cl.
*H04R 25/00* (2006.01)
*H05K 1/02* (2006.01)

(52) U.S. Cl.
CPC ......... *H04R 25/609* (2019.05); *H04R 25/603* (2019.05); *H04R 25/604* (2013.01); *H05K 1/028* (2013.01); *H04R 2225/023* (2013.01)

(58) Field of Classification Search
CPC .. H04R 25/609; H04R 25/603; H04R 25/604; H04R 2225/023
USPC ........................................................ 381/324
See application file for complete search history.

(56) References Cited

U.S. PATENT DOCUMENTS

| | | | | |
|---|---|---|---|---|
| 2001/0040973 A1* | 11/2001 | Fritz | ................... | A61B 5/6817 381/328 |
| 2001/0043707 A1* | 11/2001 | Leedom | ................ | H04R 25/65 381/328 |
| 2006/0171550 A1* | 8/2006 | Bryant | ................ | H04R 1/1016 381/322 |
| 2007/0177749 A1* | 8/2007 | Sjursen | ................ | H04R 25/602 381/322 |

FOREIGN PATENT DOCUMENTS

| | | |
|---|---|---|
| CN | 203167211 U | 8/2013 |
| CN | 205622877 U | 10/2016 |

* cited by examiner

*Primary Examiner* — Katherine A Faley
(74) *Attorney, Agent, or Firm* — Bayramoglu Law Offices LLC

(57) ABSTRACT

A flexible circuit board of a hearing aid and the hearing aid are provided. The flexible circuit board has an annular portion bent into an annular shape, wherein the annular portion is used for surrounding a peripheral side of a battery, and an outer side surface of the annular portion has pads; the flexible circuit board has a device portion located on a front side of the annular portion, wherein the device portion is used for installing electronic devices and is used for electrically connecting a receiver; the flexible circuit board has a chip portion connected to a bottom end of the annular portion, wherein the chip portion is used for binding a chip. The flexible circuit board strings together the receiver, the chip and the battery into a compact structure.

19 Claims, 8 Drawing Sheets

FLEXIBLE CIRCUIT BOARD OF HEARING AID AND HEARING AID

CROSS REFERENCE TO THE RELATED APPLICATIONS

This application is based upon and claims priority to Chinese Patent Application No. 202110305779.8, filed on Mar. 19, 2021, the entire contents of which are incorporated herein by reference.

TECHNICAL FIELD

The present disclosure relates to the field of hearing aids, in particular to a flexible circuit board of a hearing aid and the hearing aid.

BACKGROUND

A hearing aid is usually installed in or behind an ear of a user to amplify the sound for the user. Some common types of hearing aids include behind-the-ear (BTE) hearing aids, in-the-ear (ITE) hearing aids, in-the-canal (ITC) hearing aids, completely-in-canal (CIC) hearing aids, etc.

A CIC hearing aid has the advantages of small size and strong concealment. It does not require an external circuit wire or a microphone tube, so it can meet aesthetic and psychological needs of the deaf.

For more information about existing hearing aids, see the Chinese patents with the announcement No. CN205622877U and CN203167211U.

SUMMARY

The present disclosure provides a new flexible circuit board of a hearing aid and the hearing aid for further improving the hearing aids.

The present disclosure is implemented as follows: it provides a flexible circuit board of a hearing aid, wherein the flexible circuit board has an annular portion bent into an annular shape, wherein the annular portion is used for surrounding the peripheral side of a battery, and an outer side surface of the annular portion has pads; the flexible circuit board has a device portion located on a front side of the annular portion, wherein the device portion is used for installing electronic devices and is used for electrically connecting a receiver; the flexible circuit board has a chip portion connected to a bottom end of the annular portion, wherein the chip portion is used for binding a chip.

Optionally, the flexible circuit board further includes a first end plate and a second end plate, wherein the first end plate is used for fixing a microphone, and the second end plate is used for fixing a switch. A first connecting section is connected between the first end plate and the annular portion, and a second connecting section is connected between the second end plate and the annular portion; the first connecting section and the second connecting section intersect each other, and the intersection becomes an intersection position of the annular portion.

Optionally, the annular portion is divided into two sections by the device portion and the intersection position, and an outer side surface of each section has two pads.

Optionally, the bottom of the device portion is flush with the bottom of the annular portion, the top of the device portion is higher than the top of the annular portion, and a part of the device portion higher than the annular portion is used for fixing a plurality of electronic devices.

Optionally, the height of the first connecting section and the height of the second connecting section are both less than half of the height of the annular portion; a top end of the first connecting section is connected to a top end of the annular portion, and a bottom end of the second connecting section is connected to a bottom end of the annular portion.

The present disclosure further provides a corresponding hearing aid, the hearing aid including the flexible circuit board.

The flexible circuit board of the present disclosure:

The flexible circuit board has an annular portion bent into an annular shape, wherein the annular portion is used for surrounding the peripheral side of a battery, and an outer side surface of the annular portion has pads; the flexible circuit board has a device portion located on a front side of the annular portion, wherein the device portion is used for installing electronic devices and is used for electrically connecting a receiver; the flexible circuit board has a chip portion connected to a bottom end of the annular portion, wherein the chip portion is used for binding a chip. At this point, the receiver, the chip and the battery can be stringed together by the flexible circuit board into a compact structure, thereby ensuring their small size, and correspondingly enabling the size of the hearing aid to be reduced as well.

The flexible circuit board may further include a first end plate and a second end plate, wherein the first end plate is used for fixing a microphone, and the second end plate is used for fixing a switch. This design structure is ingenious and causes the microphone and the switch to be fixed in the desired position in a unique way, that is, the microphone and the switch are very uniquely and ingeniously fixed at a position as close as possible to the rear end of the entire hearing aid, so that the microphone better receives external sound, while the switch is also easier to be manually controlled by a user via the button.

An included angle between the bottom of the chip portion and the bottom surface of the annular portion may be 150-175 degrees. Such a structure can ensure the fixation of various circuit structures on the flexible circuit board, and make the entire structure small in size, while also ensuring that the corresponding entire hearing aid structure is ergonomic.

The central angle of the device portion and the intersection position at the annular portion may be 160-179 degrees. Such a structure makes the entire flexible circuit board more stable and small in size, and also ensures that the structure of the hearing aid is more ergonomic.

DETAILED DESCRIPTION OF THE EMBODIMENTS

The embodiments described below with reference to the drawings are illustrative, intended to explain the present disclosure rather than a limitation.

The present disclosure of this embodiment provides a completely-in-canal hearing aid. A hearing aid generally includes a left ear hearing aid and a right ear hearing aid which are symmetrical. This embodiment only describes the left ear hearing aid. Since the right ear hearing aid is symmetrical to the left ear hearing aid in structure, the right ear hearing aid falls within the protection scope of the present disclosure too.

The hearing aid of this embodiment includes a flexible circuit board. Therefore, this embodiment also provides a flexible circuit board of the hearing aid.

Figure 1:
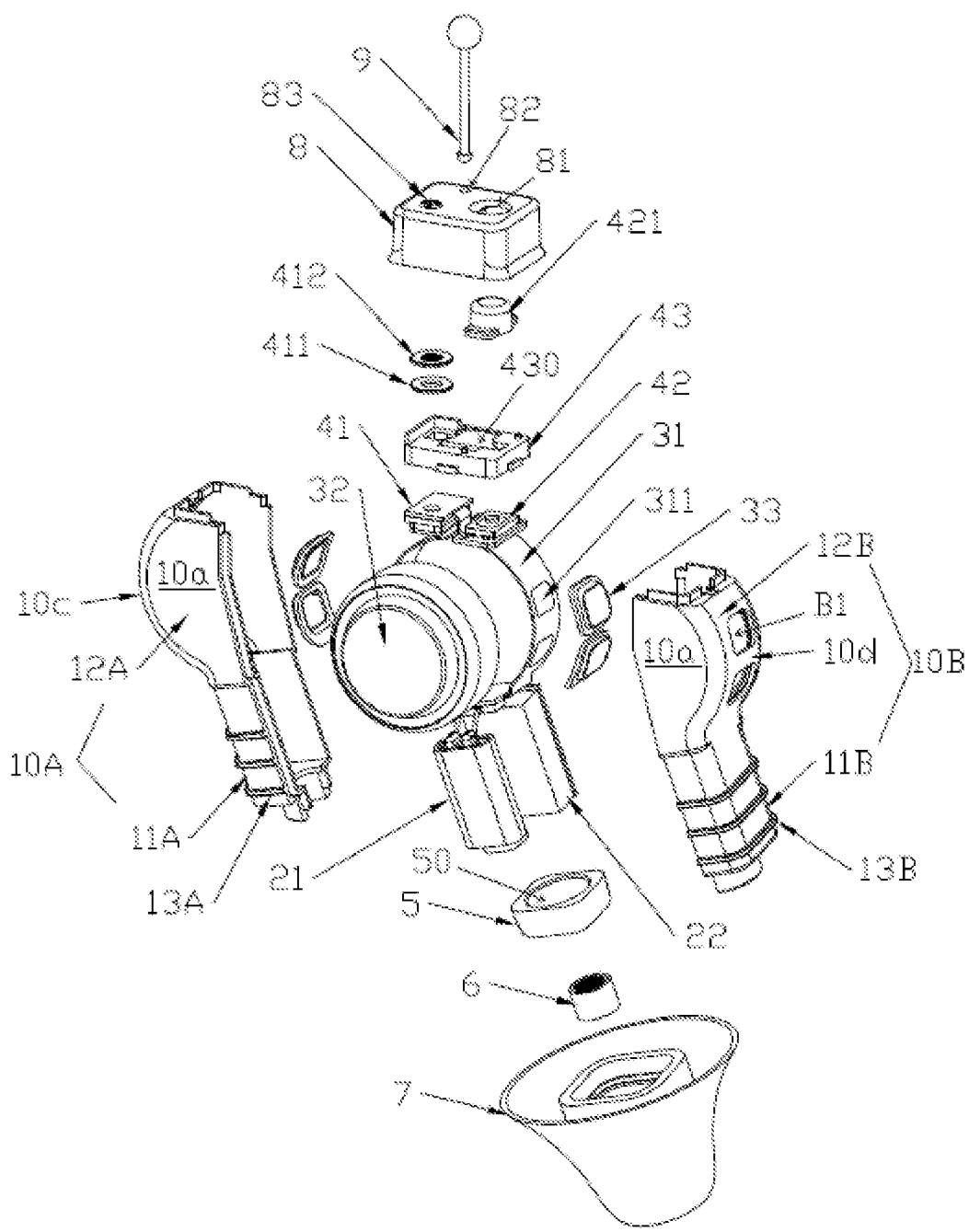
FIG. 1 is an exploded diagram of a hearing aid.

The exploded view of FIG. 1 shows that the hearing aid includes a housing 10 (10 is marked in FIGS. 6 and 7), a receiver 21, a chip 22, a flexible circuit board 31, a battery 32, a conductive contact sheet 33, a microphone 41, a switch 42, a bracket 43, a front cover 5, a cerumen cap 6, an earplug 7, a rear cover 8 and a take-out line 9. The flexible circuit board 31 includes pads 311. Sound-guiding foam 411 and a dust-proof net 412 also cooperate with the microphone 41. A button 421 also cooperates with the switch 42. The front cover 5 has a front through hole 50, and the rear cover 8 has a button hole 81, a wire hole 82 and a sound receiving port 83.

In other embodiments, there may be no button, and in this case, the rear cover may not have a button hole. In this structure, a user can switch the hearing aid's program by tapping the hearing aid while wearing it. The program switching principle of this hearing aid is that the corresponding chip can detect airflow through the microphone, and directly perform the program switching operation by sensing the change of the airflow.

Figure 6:
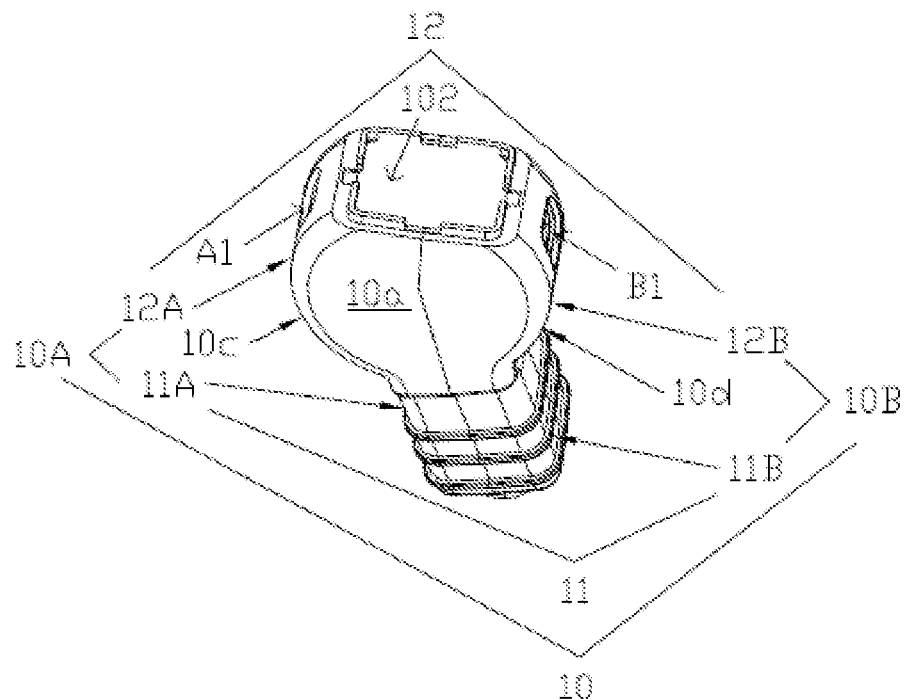
FIG. 6 is a schematic diagram of a housing from a first viewing angle.
Figure 7:
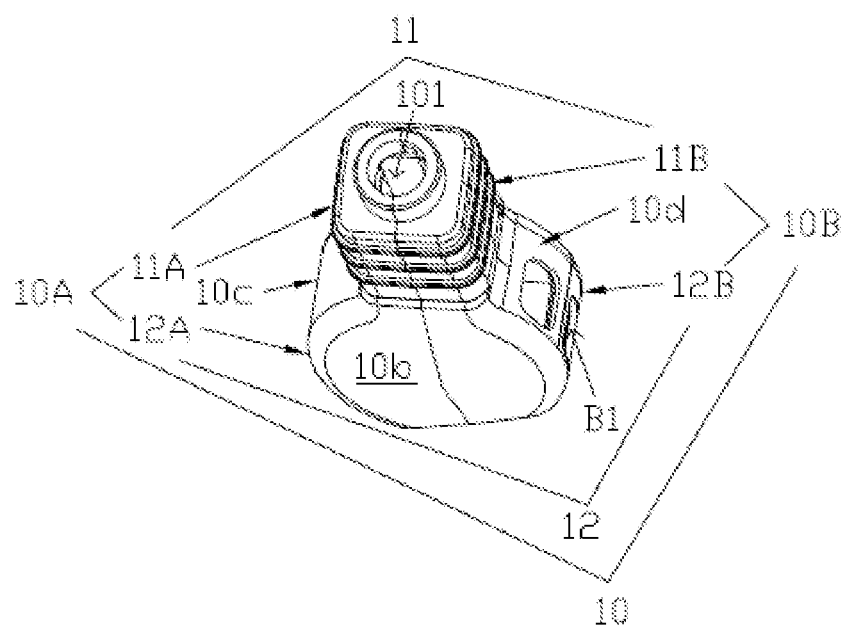
FIG. 7 is a schematic diagram of the housing from a second viewing angle.

In this embodiment, the housing 10 is divided into a front section 11 and a rear section 12, and also into a first housing 10A and a second housing 10B. Referring to FIG. 1, the housing 10 is divided into the first housing 10A and the second housing 10B, wherein the first housing 10A includes a first front section 11A and a first rear section 12A connected to each other, and the second housing 10B includes a second front section 11B and a second rear section 12B connected to each other. Referring to FIGS. 6 and 7, the housing 10 includes the front section 11 and the rear section 12, wherein the front section 11 includes the first front section 11A and the second front section 11B, and the rear section 12 includes the first rear section 12A and the second rear section 12B.

Figure 2:
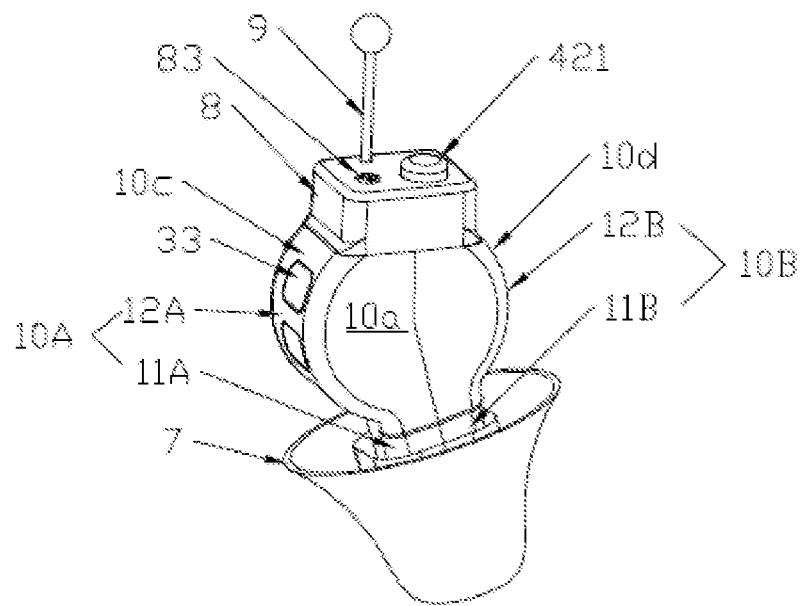
FIG. 2 is a schematic diagram of the hearing aid from a first viewing angle.
Figure 3:
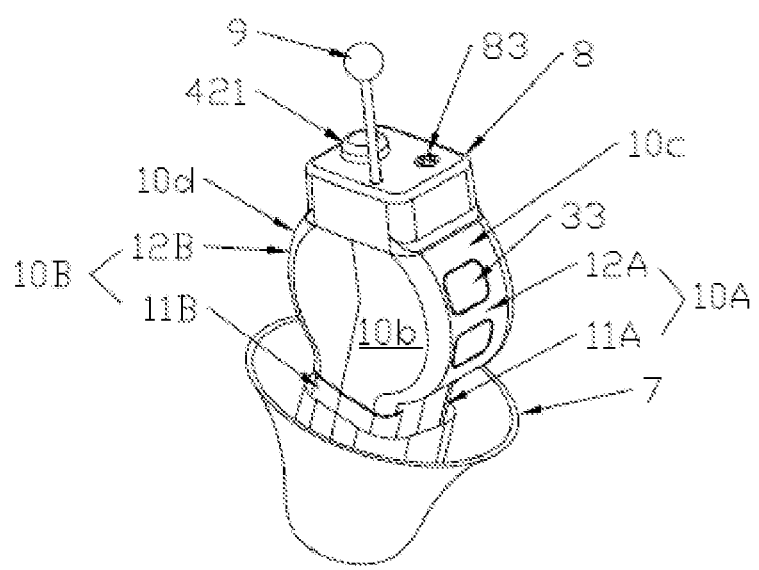
FIG. 3 is a schematic diagram of the hearing aid from a second viewing angle.

Referring to FIGS. 2 and 3, the overall appearance of the hearing aid is shown in FIGS. 2 and 3. At this point, the first housing 10A and the second housing 10B are assembled together. In FIGS. 2 and 3, the lower end of the structure corresponds to the front end of the hearing aid, and the upper end of the structure corresponds to the rear end of the hearing aid. It can be seen from FIGS. 1 to 5 that the front cover 5 is disposed at the front end of the first front section 11A and the second front section 11B, and the earplug 7 is assembled at the front end of the hearing aid through the front cover 5, that is, the earplug 7 is assembled at the front end of the housing 10, that is, the earplug 7 is disposed at the front end of the first front section 11A and the second front section 11B. Further, the earplug 7 is assembled at the front end of the first front section and the second front section through the front cover 5, and the earplug 7 is specifically assembled at the front end of the first front section 11A and the second front section 11B through the front cover 5, and the earplug 7 is connected and fixed to the front end of the first front section 11A and the second front section 11B through the front cover 5.

The earplug 7 used in this embodiment is a horn-shaped earplug. In other embodiments, the earplug may be in other shapes.

Referring back to FIG. 1, an outer surface of the first front section 11A has a first outer convex edge 13A, and an outer surface of the second front section 11B has a second outer convex edge 13B. The first outer convex edge 13A and the second outer convex edge 13B are used for fitting the assembly of the earplug 7, so that the earplug 7 is not easy to fall off.

Referring to FIG. 6, the rear section 12 has a rear opening 102. Referring to FIG. 7, the front section 11 has a front opening 101.

It can be seen from FIGS. 1 to 5 that the cerumen cap 6 is installed between the front opening 101 and the front end of the first front section 11A and the second front section 11B, that is, it is installed between the front cover 5 and the front end of the housing 10. In addition, it can be seen from FIGS. 1 to 9 that the cerumen cap 6 is arranged in the front through hole 50 of the front cover 5.

FIGS. 2 and 3 also show that when the earplug 7 is horn-shaped, the widest part of the entire hearing aid is only the diameter of the horn edge of the earplug 7. The width of the housing 10 is smaller than the diameter of the horn edge, and the thickness of the housing 10 is further smaller, so that the hearing aid is of a compact structure, the entire hearing aid can basically enter the user's ear canal, and the hearing aid is a completely-in-canal hearing aid.

Figure 4:
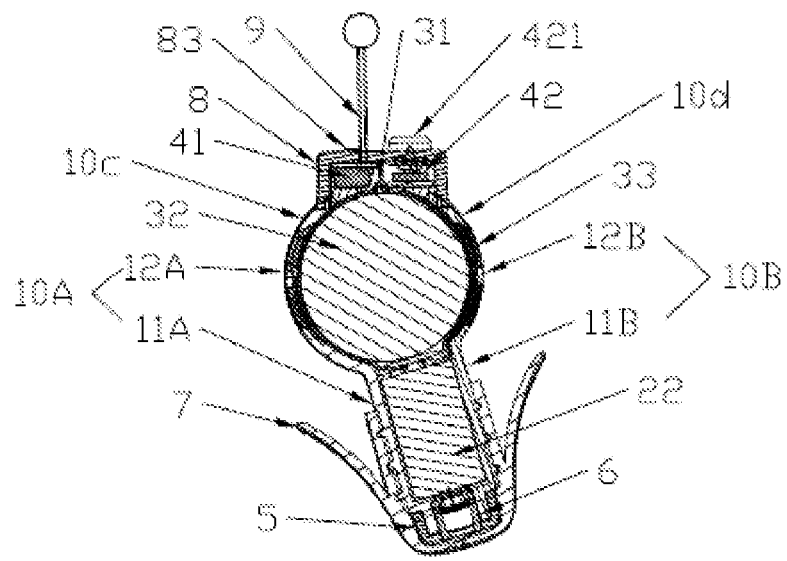
FIG. 4 is a schematic diagram of a first cross-sectional structure of the hearing aid.
Figure 5:
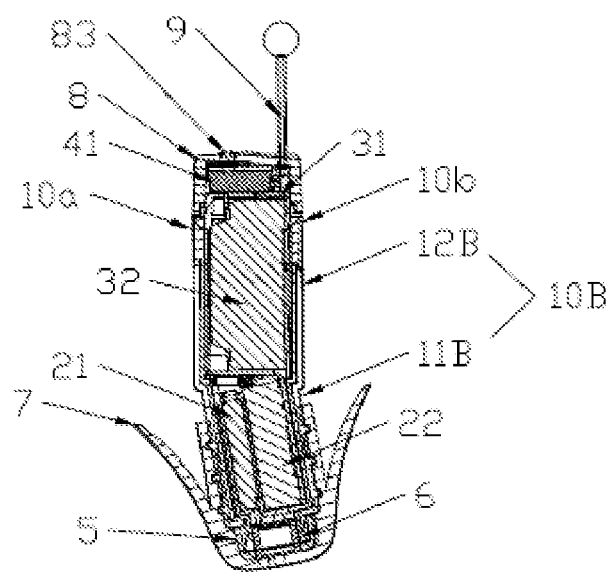
FIG. 5 is a schematic diagram of a second cross-sectional structure of the hearing aid.

FIGS. 4 and 5 show the cross-sectional structure of the hearing aid from two different viewing angles, wherein FIG. 4 is a cross section obtained by cutting a plane parallel to the length and width of the hearing aid, and FIG. 5 is a cross section obtained by cutting a plane parallel to the thickness and length of the hearing aid. It can be seen from the two cross-sectional views that the hearing aid is compact, so the size can be small.

FIGS. 4 and 5 also show that the flexible circuit board 31 is on the peripheral side of the battery 32. FIG. 4 shows that the battery 32 inside the housing 10 is a structure with the largest width. Therefore, the width of the housing 10 only needs to be slightly larger than the battery 32, which again proves that the entire hearing aid is small in width and size.

Referring to FIGS. 1 to 5, the receiver 21 and the chip 22 are located in the front section 11 of the housing 10, which helps to reduce the size of the hearing aid and also ensures that the user can get a greater sound output and the whole structure is steady and durable.

Referring to FIGS. 1 to 5, the battery 32 is located in the rear section 12 of the housing 10, and a large portion of the rear section 12 is similar in appearance to the battery 32 as shown in FIG. 4, which again helps to reduce the size of the hearing aid.

Referring to FIGS. 1 to 9, the appearance of the front section 11 is basically a chamfered cuboid, the chip 22 is a cuboid, and the receiver 21 is also substantially a cuboid. The chip 22 is arranged on a part of the flexible circuit board 31, and specifically arranged on a chip portion 314, as shown in subsequent FIGS. 10 and 11; the receiver 21 is electrically connected to the flexible circuit board 31 through a corresponding wire (not marked), and specifically electrically connected to a device portion 313, as shown in subsequent FIGS. 10 and 11.

Figure 8:
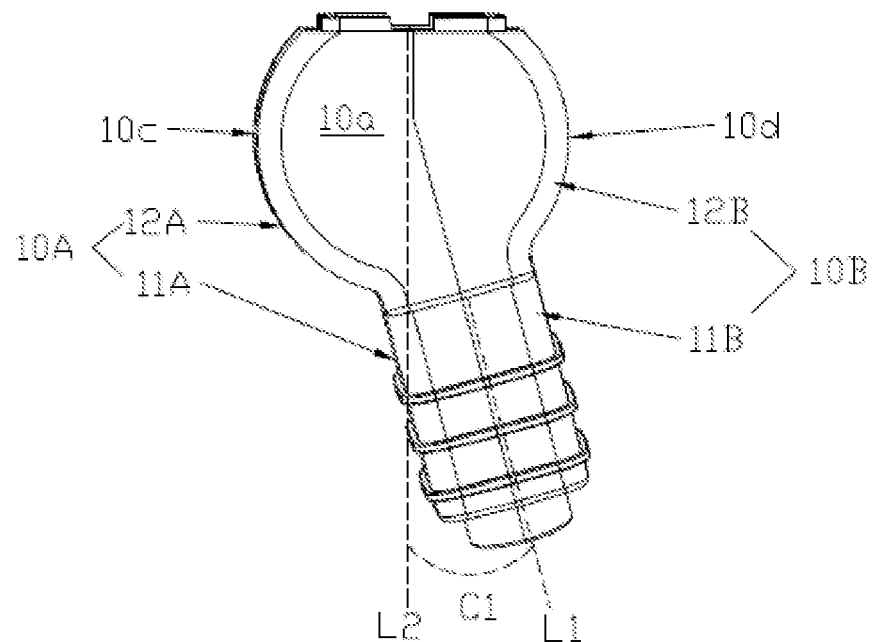
FIG. 8 is a schematic diagram of the housing from a third viewing angle.

Referring to FIGS. 1 to 9, the two opposite surfaces (i.e., the first surface 10a and the second surface 10b) of the rear section 12 are planes. In FIG. 1, the first surface 10a is divided into two parts, and FIGS. 2, 6 and 8 show that the two parts are joined together.

Referring to FIGS. 1 to 9, the rear section 12 has two substantially symmetrical opposite side surfaces, and the two opposite side surfaces are a first side surface 10c and a second side surface 10d, respectively. That is to say, the first housing 10A and the second housing 10B each have an opposite side surface, the first housing 10A has the first side surface 10c, and the second housing 10B has the second side surface 10d.

The first side surface 10c is a part of a basically cylindrical side surface, and the second side surface 10d is the other part of the basically cylindrical side surface. The two side surfaces are basically symmetrical. However, the first side surface 10c may be slightly larger than the second side surface 10d (not affecting the basic symmetry of them), and the length of the first side surface 10c is slightly longer than the length of the second side surface 10d, as shown in FIG. 8. The length difference is usually on the order of millimeters, such as 2.59 mm, without affecting the basic symmetry of the two side surfaces.

In summary, in one aspect, the front section 11 is of a cuboid hollow cylindrical structure as a whole, and the receiver 21 and the chip 22 are tightly arranged in the front section 11; in another aspect, the first surface 10a, the second surface 10b, the first side surface 10c and the second side surface 10d of the rear section 12 define a relatively regular flat structure, and the appearance of the rear section 12 is roughly similar to that of the battery 32, that is, the design of the two opposite surfaces and the two opposite side surfaces of the rear section 12 causes the battery 32 to be tightly located in the rear section 12, so that the width and size of the hearing aid are reduced. Therefore, both aspects help to reduce the size of the hearing aid.

In this embodiment, the front section 11 has a first central axis parallel to the length thereof. The rear section 12 has a second central axis located between the two opposite surfaces (the first surface 10a and the second surface 10b) and between the two opposite side surfaces (the first side surface 10c and the second side surface 10d). The first central axis and the second central axis are different straight lines, that is, there will be an included angle greater than zero between the two central axes.

In FIG. 8, the first central axis of the front section 11 is embodied as dashed line L1, and the second central axis of the rear section 12 is embodied as dashed line L2, and the two lines are different straight lines.

Figure 9:
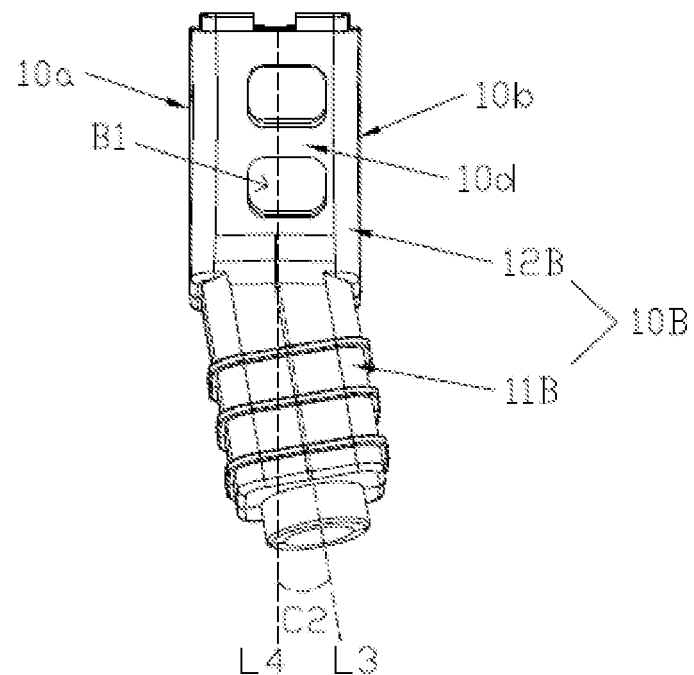
FIG. 9 is a schematic diagram of the housing from a fourth viewing angle.

In FIG. 9, the first central axis of the front section 11 is embodied as dashed line L3, and the second central axis of the rear section 12 is embodied as dashed line L4, further indicating that the two lines are different straight lines.

In this embodiment, the first central axis of the front section 11 and the second central axis of the rear section 12 are designed to be different straight lines, so that the appearance of the hearing aid is more ergonomic, and at the same time, it is beneficial to the reduction of size.

In FIG. 8, an included angle between dashed line L1 and dashed line L2 is the included angle between the aforementioned two central axes at the viewing angle shown in FIG. 8. This included angle is also an included angle between a first plane (not marked) and a second plane (not marked). A plane bisecting the width of the front section 11 and bisecting the front opening 101 is the first plane (that is, the first plane can be represented by dashed line L1 in FIG. 8), and a plane bisecting the width of the rear section 12 and bisecting the rear opening 102 is the second plane (that is, the second plane can be represented by dashed line L2 in FIG. 8).

In this embodiment, the included angle C1 between the first plane and the second plane is designed to be 5-30 degrees. If the included angle C1 is larger than this angle range, it will not be beneficial to the use of human ears, and if the included angle C1 is smaller than this angle range, it will not be beneficial to the reduction of the length. At the same time, this angle range is ergonomic.

In FIG. 9, an included angle between dashed line L3 and dashed line L4 is the included angle between the aforementioned two central axes at the viewing angle shown in FIG. 9. This included angle is also an included angle between a third plane (not marked) and a fourth plane (not marked). A plane bisecting the thickness of the front section 11 is the third plane (that is, the third plane can be represented by dashed line L3 in FIG. 9), and a plane bisecting the thickness of the rear section 12 is the fourth plane (that is, the fourth plane can be represented by dashed line L4 in FIG. 9).

In this embodiment, the included angle C2 between the third plane and the fourth plane is designed to be 1-20 degrees. If the included angle C2 is larger than this angle range, it will not be beneficial to the use of human ears, and if the included angle C2 is smaller than this angle range, it will not be beneficial to the reduction of the length. At the same time, this angle range is ergonomic.

At the same time, the included angle C1 and the included angle C2 coordinate and cooperate with each other, jointly defining the angle relationship between the front section 11 and the rear section 12, which makes the entire hearing aid structure coordinated, and makes the overall shape of the housing 10 resemble the Arabic numeral 6. Such an angle range combined with the shape of the housing makes the overall design exquisite, makes the hearing aid comfortable to wear and easy to take out, achieves good use performance, and ensures that the hearing aid has a small size.

Figure 11:
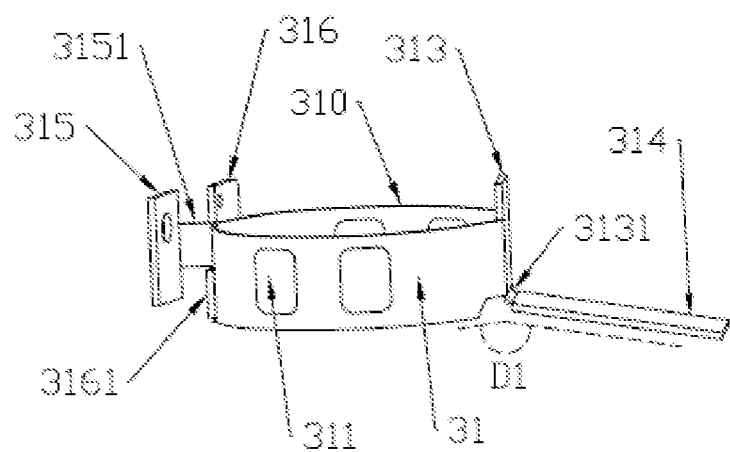
FIG. 11 is a schematic diagram of the flexible circuit board from a second viewing angle.
Figure 12:
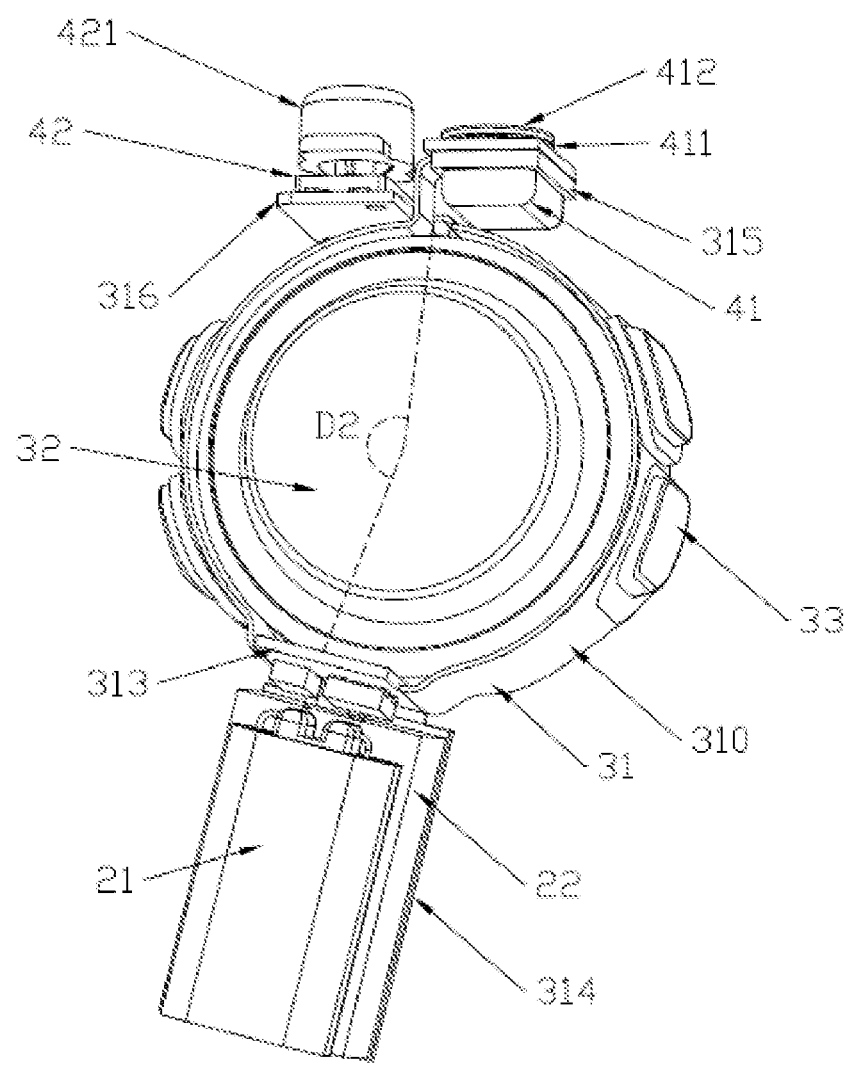
FIG. 12 is a schematic diagram of assembly of a corresponding structure of a flexible circuit board.

In this embodiment, the battery 32 is a button battery and is rechargeable. In this embodiment, the battery 32 is an important factor influencing the shape of the rear section 12 because the inside of the rear section 12 is mainly used for accommodating the battery 32. In this embodiment, the main body of the flexible circuit board 31 is bent into an annular portion 310 (referring to subsequent FIGS. 10 and 11), as shown in FIGS. 4, 5 and 12, specifically the annular portion 310 of the flexible circuit board 31 surrounds the peripheral side of the battery 32, and this is also related to the fact that the battery 32 is a button battery. Specifically, the flexible circuit board 31 may be pasted on the peripheral side of the battery 32 by using double-sided tape (not shown).

In this embodiment, an outer side surface of the first rear section 12A and the second rear section 12B respectively has side holes, the first rear section 12A has two first side holes A1, and the second rear section 12B has two second side holes B1. A conductive contact sheet 33 is assembled in each of these side holes. Four conductive contact sheets 33 are respectively electrically connected to four pads 311 on the outer side surface of the flexible circuit board 31, and reference may be made to FIGS. 1 and 4.

Referring to FIGS. 1, 4 and 5, the bracket 43 is used for fixing an intersection position of the flexible circuit board 31, and the bracket 43 is also used for fixing the switch 42 and the microphone 41 at the same time. The bracket 43 cooperates with the rear cover 8 to protect the conductive foam 411 and the dust-proof net 412 that cooperate with the microphone 41 in conjunction with FIGS. 1 and 13.

Referring to FIGS. 1 and 4, the rear end of the hearing aid is the rear cover 8, and the rear end of the housing 10 is sealed by the rear cover 8. One end of the button 421 is exposed outside the rear cover 8, and the other end is located in the rear cover 8 and pressed against on the switch 42, so that the user can control the switch 42 through the button 421.

Referring to FIGS. 1 and 4, the take-out line 9 is installed at the rear cover 8, that is, the rear cover 8 and the take-out line 9 are assembled together. In addition, the main part of the take-out line 9 is exposed from the rear cover 8. The take-out line 9 has a larger end than the wire body (not distinctively marked), and the take-out line 9 is used for facilitating the take-out of the hearing aid.

Referring to FIGS. 1-9, the rear cover 8 of this embodiment is small in size, and the width of the rear cover 8 is smaller than the width of the rear section 12, resulting in a reduced size of the hearing aid, i.e., further ensuring a smaller size of the hearing aid.

As mentioned above, this embodiment also provides a flexible circuit board 31.

Figure 10:
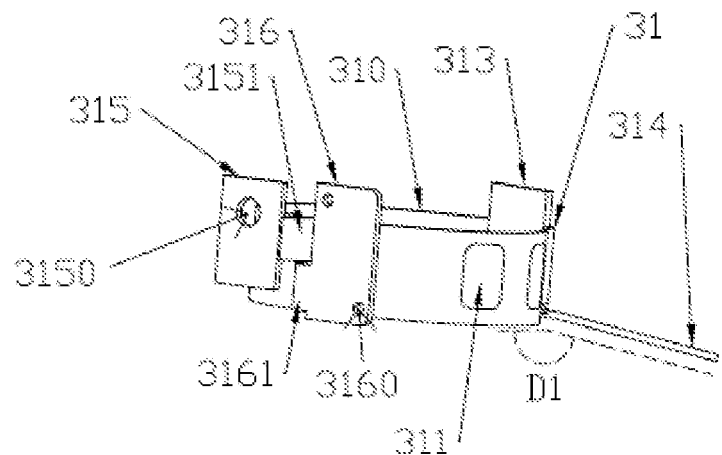
FIG. 10 is a schematic diagram of a flexible circuit board from a first viewing angle.

The flexible circuit board 31 has an annular portion 310 bent into an annular shape, and the annular portion 310 is used for surrounding the peripheral side of the battery 32. The outer surface of the annular portion 310 has a pad 311, and the pad 311 is used for electrically connecting the conductive contact sheet 33. FIGS. 10 and 11 further show that the flexible circuit board 31 has a device portion 313 located on the front side of the annular portion 310, and the device portion 313 is used for installing electronic devices (not marked) and is used for electrically connecting the receiver 21; the flexible circuit board 31 has a chip portion 314 connected to the bottom end of the annular portion 310, and the chip portion 314 is used for binding the chip 22 of the hearing aid. At this point, the receiver 21, the chip 22 and the battery 32 can be stringed together by the flexible circuit board 31 into a compact structure, thereby ensuring their small size, and correspondingly enabling the size of the hearing aid to be reduced as well.

It should be noted that the front side of the annular portion 310 where the device portion 313 is located is not directly in front of the annular portion 310, but a slight deviation of 10-20 degrees. This angle can refer to the included angle C1 in FIG. 8 or the complementary angle (not marked) of the central angle D2 in FIG. 12.

Referring to FIGS. 10 and 11, the flexible circuit board 31 further includes a first end plate 315 and a second end plate 316, wherein the first end plate 315 is used for fixing the microphone 41, and the second end plate 316 is used for fixing the switch 42. This design structure is ingenious and causes the microphone 41 and the switch 42 to be fixed in the desired position in a unique way, that is, the microphone 41 and the switch 42 are very uniquely and ingeniously fixed at a position as close as possible to the rear end of the entire hearing aid, so that the microphone 41 better receives external sound, while the switch 42 is also easier to be manually controlled by the user via the button 421.

Referring to FIGS. 10 and 11, a first connecting section 3151 is connected between the first end plate 315 and the annular portion 310, and a second connecting section 3161 is connected between the second end plate 316 and the annular portion 310. That is to say, the first end plate 315 and the annular portion 310 are connected by the first connecting section 3151, and the second end plate 316 and the annular portion 310 are connected by the second connecting section 3161.

Figure 13:
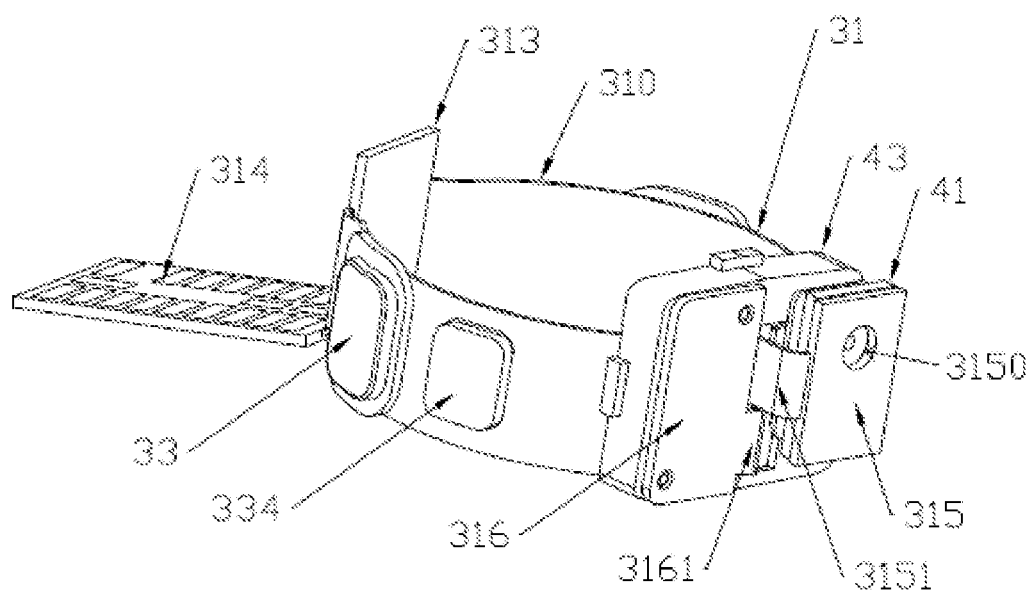
FIG. 13 is a schematic diagram of an assembly structure of a flexible circuit board, a bracket, a conductive contact sheet and a microphone.

The first connecting section 3151 and the second connecting section 3161 intersect each other, and the intersection becomes an intersection position (not marked) of the annular portion 310. The first end plate 315 and the second end plate 316 expand in two directions from the intersection position. The bracket 43 just clamps the intersection through an internal opening 430 thereof (referring to FIG. 1), and the flexible circuit board 31 maintains a good bending shape as shown in FIGS. 10 and 11. Reference may be made to FIG. 13 in combination with FIG. 4.

FIG. 12 shows that the annular portion 310 is divided into two sections by the device portion 313 and the intersection position. The outer side surface of each section has two pads 311, and each pad has a conductive contact sheet 33.

The bottom of the device portion 313 is flush with the bottom of the annular portion 310, and the top of the device portion 313 is higher than the top of the annular portion 310. The part of the device portion 313 higher than the annular portion 310 is used for placing a plurality of electronic devices (not labeled). For example, one electronic device may be a power field effect transistor, and the other may be a power supply voltage monitor.

Referring to FIGS. 10 and 11, the height of the first connecting section 3151 and the height of the second connecting section 3161 are both less than half of the height of the annular portion 310. A top end of the first connecting section 3151 is connected to and flush with a top end of the annular portion 310, referring to FIG. 11, and a bottom end of the second connecting section 3161 is connected to and flush with a bottom end of the annular portion 310, referring to FIG. 10. Such a structure ensures that the first connecting section 3151 and the second connecting section 3161 are staggered in the middle, thereby ensuring that the first connecting section 3151 and the second connecting section 3161 can intersect smoothly, and better ensuring the stability of the structure of the entire flexible circuit board 31.

Referring to FIG. 10, the first end plate 315 has a sound transmission hole 3150, and the second end plate 316 has two positioning holes 3160. The sound transmission hole 3150 is used for cooperating with the sound reception of the microphone 41, and the positioning holes 3160 are used for the installation of the switch 42.

The chip portion 314 is connected to the bottom end of the device portion 313, and there is a bent connecting portion 3131 there between referring to FIG. 11.

An included angle between the bottom of the chip portion 314 and the bottom surface of the annular portion 310 may be 150-175 degrees. In FIGS. 10 and 11, the included angle is shown by an angle D1, that is, the angle D1 is 150-175 degrees. Such a structure can ensure the fixation of various circuit structures on the flexible circuit board, and make the entire structure small in size, while also ensuring that the corresponding entire hearing aid structure is ergonomic.

The central angle of the device portion 313 and the intersection position at the annular portion 310 may be 160-179 degrees. In FIG. 12, the included angle is shown by a central angle D2, that is, the central angle D2 is 160-179 degrees. Such a structure makes the entire flexible circuit board 31 more stable and small in size, and also ensures that the structure of the hearing aid is more ergonomic.

Although embodiments of the present disclosure have been shown and described, those of ordinary skill in the art may make variations, modifications, substitutions and alterations to the above embodiments within the scope of the present disclosure, which is defined by the appended claims.

What is claimed is:

1. A flexible circuit board of a hearing aid, wherein the flexible circuit board has an annular portion bent into an annular shape, the annular portion is used for surrounding a peripheral side of a battery, and an outer side surface of the annular portion has pads;
the flexible circuit board has a device portion located on a front side of the annular portion, and the device portion is used for installing electronic devices and the device portion is used for electrically connecting a receiver; and
the flexible circuit board has a chip portion connected to a bottom end of the annular portion, and the chip portion is used for binding a chip, further comprising a first end plate and a second end plate, wherein the first end plate is used for fixing a microphone, and the second end plate is used for fixing a switch,
wherein an included angle between a bottom of the chip portion and a bottom surface of the annular portion is 150-175 degrees.

2. A hearing aid, comprising the flexible circuit board according to claim 1.

3. The hearing aid according to claim 2, further comprising a first end plate and a second end plate, wherein the first end plate is used for fixing a microphone, and the second end plate is used for fixing a switch.

4. The hearing aid according to claim 3, wherein a first connecting section is connected between the first end plate and the annular portion, and a second connecting section is connected between the second end plate and the annular portion; the first connecting section and the second connecting section intersect each other, and an intersection becomes an intersection position of the annular portion.

5. The hearing aid according to claim 4, wherein the annular portion is divided into two sections by the device portion and the intersection position, and an outer side surface of each section has two pads of the pads.

6. The hearing aid according to claim 4, wherein a bottom of the device portion is flush with a bottom of the annular portion, a top of the device portion is higher than a top of the annular portion, and a part of the device portion higher than the annular portion is used for fixing the electronic devices.

7. The hearing aid according to claim 4, wherein a height of the first connecting section and a height of the second connecting section are both less than half of a height of the annular portion; a top end of the first connecting section is connected to a top end of the annular portion, and a bottom end of the second connecting section is connected to the bottom end of the annular portion.

8. The hearing aid according to claim 3, wherein the chip portion is connected to a bottom end of the device portion, and a bent connecting portion is provided between the chip portion and the bottom end of the device portion; the first end plate has a sound transmission hole, and the second end plate has two positioning holes.

9. The flexible circuit board according to claim 1, wherein a first connecting section is connected between the first end plate and the annular portion, and a second connecting section is connected between the second end plate and the annular portion; the first connecting section and the second connecting section intersect each other, and an intersection becomes an intersection position of the annular portion.

10. The flexible circuit board according to claim 9, wherein the annular portion is divided into two sections by the device portion and the intersection position, and an outer side surface of each section has two pads of the pads.

11. The flexible circuit board according to claim 9, wherein a bottom of the device portion is flush with a bottom of the annular portion, a top of the device portion is higher than a top of the annular portion, and a part of the device portion higher than the annular portion is used for fixing the electronic devices.

12. The flexible circuit board according to claim 9, wherein a height of the first connecting section and a height of the second connecting section are both less than half of a height of the annular portion; a top end of the first connecting section is connected to a top end of the annular portion, and a bottom end of the second connecting section is connected to the bottom end of the annular portion.

13. A flexible circuit board of a hearing aid, wherein the flexible circuit board has an annular portion bent into an annular shape, the annular portion is used for surrounding a peripheral side of a battery, and an outer side surface of the annular portion has pads;
the flexible circuit board has a device portion located on a front side of the annular portion, and the device portion is used for installing electronic devices and the device portion is used for electrically connecting a receiver; and
the flexible circuit board has a chip portion connected to a bottom end of the annular portion, and the chip portion is used for binding a chip,
further comprising a first end plate and a second end plate, wherein the first end plate is used for fixing a microphone, and the second end plate is used for fixing a switch,
wherein a central angle of the device portion and the intersection position with reference to a circle defined by the annular portion is 160-179 degrees.

14. The flexible circuit board according to claim 13, wherein a first connecting section is connected between the first end plate and the annular portion, and a second connecting section is connected between the second end plate and the annular portion; the first connecting section and the second connecting section intersect each other, and an intersection becomes an intersection position of the annular portion.

15. The flexible circuit board according to claim 14, wherein the annular portion is divided into two sections by the device portion and the intersection position, and an outer side surface of each section has two pads of the pads.

16. The flexible circuit board according to claim 14, wherein a bottom of the device portion is flush with a bottom of the annular portion, a top of the device portion is higher than a top of the annular portion, and a part of the device portion higher than the annular portion is used for fixing the electronic devices.

17. The flexible circuit board according to claim 14, wherein a height of the first connecting section and a height of the second connecting section are both less than half of a height of the annular portion; a top end of the first connecting section is connected to a top end of the annular portion, and a bottom end of the second connecting section is connected to the bottom end of the annular portion.

18. The flexible circuit board according to claim 13, wherein the chip portion is connected to a bottom end of the device portion, and a bent connecting portion is provided between the chip portion and the bottom end of the device portion; the first end plate has a sound transmission hole, and the second end plate has two positioning holes.

19. A hearing aid, comprising the flexible circuit board according to claim 13.

\* \* \* \* \*